United States Patent [19]

Nelson et al.

[11] Patent Number: 4,909,315
[45] Date of Patent: Mar. 20, 1990

[54] FLUID HEAT EXCHANGER FOR AN ELECTRONIC COMPONENT

[75] Inventors: Richard D. Nelson, Austin, Tex.; Omkarnath R. Gupta, Englewood, Colo.; Dennis J. Herrell, Austin, Tex.

[73] Assignee: Microelectronics and Computer Technology Corporation, Austin, Tex.

[21] Appl. No.: 251,273

[22] Filed: Sep. 30, 1988

[51] Int. Cl.[4] .............................................. H01L 23/46
[52] U.S. Cl. .................................. 165/80.3; 165/185; 165/908; 361/384; 361/385
[58] Field of Search .............. 165/168, 185, 170, 80.3, 165/908; 361/384, 385, 383

[56] References Cited

U.S. PATENT DOCUMENTS

| | | | |
|---|---|---|---|
| 3,909,118 | 9/1975 | Schmidt | 165/908 |
| 4,072,188 | 2/1978 | Wilson et al. | |
| 4,558,395 | 12/1985 | Yamada et al. | 361/385 |
| 4,561,040 | 12/1985 | Eastman et al. | 361/385 |
| 4,573,067 | 2/1986 | Tuckerman et al. | |
| 4,614,227 | 9/1986 | Vogel | |
| 4,631,636 | 12/1986 | Andrews | |
| 4,715,438 | 12/1987 | Gabuzda et al. | 165/185 |
| 4,783,721 | 11/1988 | Yamamoto et al. | 361/385 |

FOREIGN PATENT DOCUMENTS

| | | | |
|---|---|---|---|
| 151068 | 8/1985 | European Pat. Off. | |
| 151546 | 8/1985 | | |
| 1356114 | 6/1974 | United Kingdom | 165/908 |

Primary Examiner—Albert W. Davis, Jr.
Attorney, Agent, or Firm—Fulbright & Jaworski

[57] ABSTRACT

A high performance fluid heat exchanger for cooling an electronic component which includes a housing having a base heat transfer member, a plurality of parallel fins in the housing and center fed concentric inlet and outlet tubes connected to the housing opposite the base for supplying cooling fluid towards the base and to the ends of the fins.

2 Claims, 1 Drawing Sheet

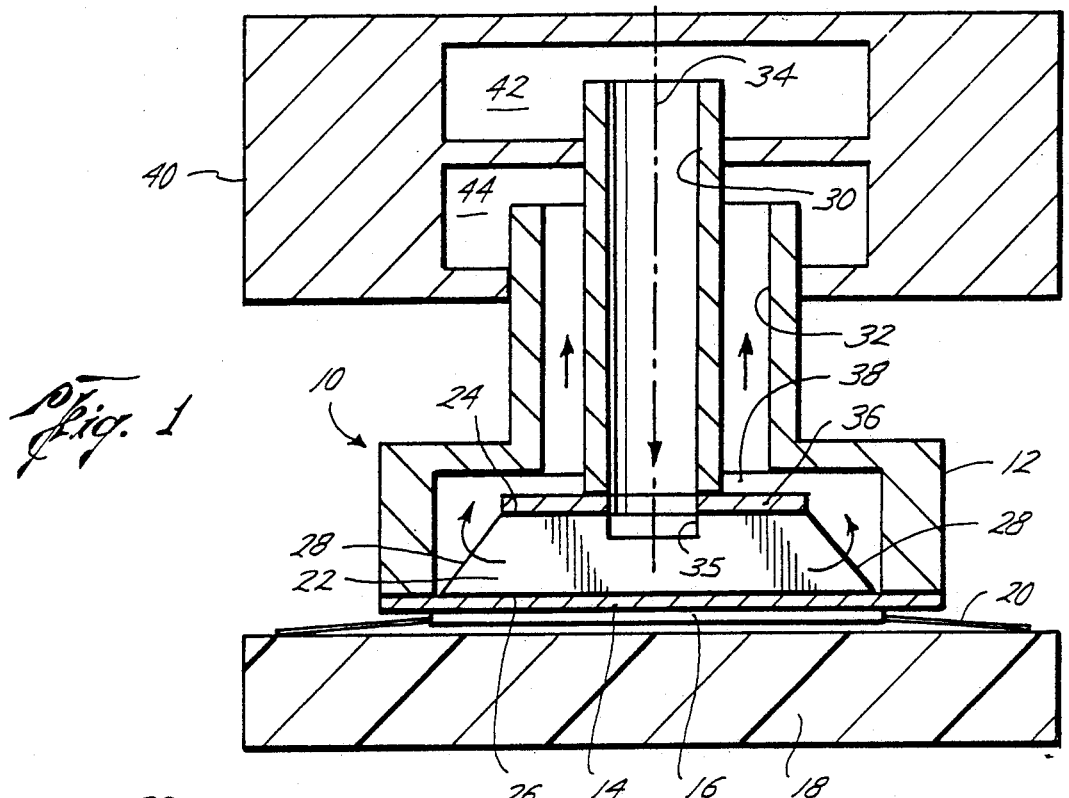
Fig. 1
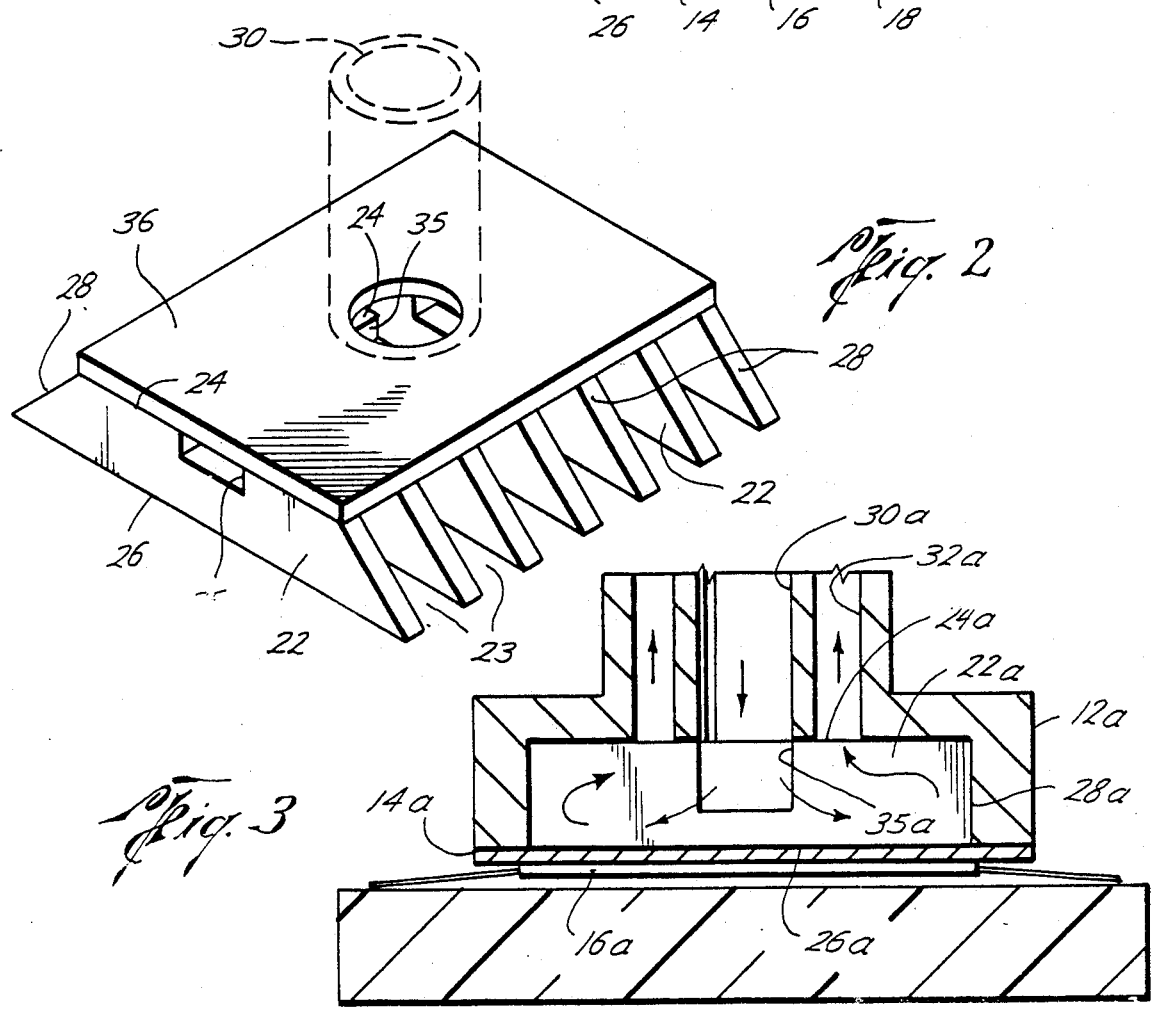
Fig. 2
Fig. 3

FLUID HEAT EXCHANGER FOR AN ELECTRONIC COMPONENT

BACKGROUND OF THE INVENTION

Liquid cooling heat exchangers for cooling electronic components are in use to cool high power electronic chips. Greater heat transfer and maximum power density can be provided by using finned heat exchange surfaces.

The present invention is directed to an improved high performance heat exchanger for cooling electronic components, such as chips, by balancing thermal resistance, spatial temperature variations, pressure drop and space requirements.

SUMMARY

The present invention is directed to a center fed fluid heat exchanger for cooling an electronic component and includes a housing having a base for receiving heat from an electronic component. A plurality of parallel spaced fins each having a top, bottom and two ends are provided with the bottoms connected to the base in which the fins are perpendicular to the base. Concentric inner fluid inlet and outer fluid outlet tubes are in communication with the housing opposite the base and have a longitudinal axis perpendicular to the base. The axis is directed towards the fins and the base between the ends of the fins for directing a cooling fluid from the inner inlet tube towards the fins and the base and towards the ends of the fins.

Still a further object of the present invention is wherein the longitudinal axis of the tubes are directed to the center of the base for increasing the heat transfer by the cooling fluid in the center of the electronic component since the center tends to be hotter than other areas.

Yet a still further object of the present invention is wherein the tops of the fins include a recess in communication with the inlet tube for supplying cooling fluid to all of the fins.

Yet a further object of the present invention is wherein a plate is provided on the tops of the fins on opposite sides of the inlet tube for directing inlet cooling fluid from the inlet tube towards both ends of the fins. The housing includes a passageway extending from the ends of the fins to the outlet tube.

Still a further object of the present invention is wherein the ends of the fins are tapered downwardly and outwardly from the tops to the bottoms for decreasing the pressure drop and heat transfer at the ends of the fins.

Yet a further object of the present invention is wherein the inlet tube is positioned adjacent the tops of the fins for impinging cooling fluid onto the fins and the base.

Other and further objects, features and advantages will be apparent from the following description of presently preferred embodiments of the invention, given for the purpose of disclosure and taken in conjunction with the accompanying drawing.

BRIEF DESCRIPTION OF THE DRAWING

FIG. 1 is an elevational view, in cross section, of one embodiment of the present invention, FIG. 2 is an enlarged perspective view of the fin structure inside of the apparatus of FIG. 1, FIG. 3 is a fragmentary elevational view, in cross section, of another embodiment of the present invention.

DESCRIPTION OF THE PREFERRED EMBODIMENT

Referring now to the drawings, and particularly to FIGS. 1 and 2, the reference numeral 10 generally indicates the fluid heat exchanger of the present invention. While any suitable cooling fluid can be such as a gas or liquid, the present invention will be described for the purpose of illustration only, as using water. The apparatus 10 includes a housing 12 having a base 14. The base 14 is adapted to be part of or attached to an electronic component 16 such as an electronic chip which may be connected to a substrate 18 by suitable electrical connections 20. In any event, the base 14 is positioned relative to the chip 16 for receiving heat therefrom.

A plurality of parallel spaced fins 22 are provided. Each of the fins 22 includes a top 24, a bottom 26 and ends 28. The bottoms 26 of the fins 22 are connected to or made integral with the base 14 and the fins are positioned in planes perpendicular to the base 14. Concentric inner fluid inlet tube 30 and outer fluid outlet tube 32 are connected to the housing 12 opposite the base 14 and have a longitudinal axis 34 directed towards the fins 22 between the ends 28 of the fins 22. Thus, incoming cooling liquid flows downwardly through the inlet tube 30, preferably to the center of the base 14, and in the channels 23 between the fins 22 and is then directed to both ends 28 of the fins 22. Splitting the flow of the center fed cooling liquid results in lower pressure drops across the fins 22.

The cross-sectional area of the inlet 30 and outlet 32 tubes is less than the cross-sectional area of the base 14. In order to supply cooling fluid to the channels 23 between the fins 22 which are not directly under the outlet end of the inlet tube 30 a recess 35 is provided in the tops 24 of the fins 22 for supplying cooling fluid to all of the fins 22.

Preferably, plate 36 is provided on the tops 24 of the fins 22 around the inlet tube 30 for insuring that the fluid flow of the cooling liquid passes from the centers of the fins 22 to both ends 28 of the fins 22 for maximum cooling. A passageway 38 is provided in the housing from the channels 23, over the tops of the plate 36, and into communication with the outlet tube 32.

The center of the electronic component 16 is normally the hotter area. It is to be noted that the incoming flow through the inlet tube 30 is directed towards the center of the heat exchanger 12 for cooling this hotter area. It is also to be noted that the liquid velocity is higher in the center of the heat exchanger 12 because of the position of the inlet tube 30. The present invention provides control of the spatial temperature variations across the face of the chip 16 by adjusting the shape and size of the recess 35 to provide more fluid flow at the center and tailor the flow elsewhere to maintain approximately uniform temperatures. While the recess is shown generally rectangular, it may be other shapes, such as triangular, and is sized to provide both optimum temperature profiles and low pressure drop.

It is further noted that the inlet tube 30 is positioned adjacent the tops 24 of the fins 22 causing the inlet cooling fluid to impinge on the fins 22 and the base 14. The impingement of the cooling fluid on the base 14 in a perpendicular direction creates a non-steady flow phenomenon against the base 14 and the sides of the fins 22 increasing the heat transfer coefficient in the center of the housing 12 and chip 16.

Preferably, the ends 28 of the fins 22 are tapered downwardly and outwardly from the tops 24 to the bottoms 26 for decreasing the pressure drop and lowering the heat transfer at the ends of the fins. The heat transfer at the fins 22 is a function of the width of the channels 23 between the fins, the fin thickness and fin height. In a preferred embodiment for the application to chip power densities of 50 to 100 watts/square centimeter, copper fins 0.1 inch high by 0.010 to 0.020 inch thick could be used with channel spacings of 0.010 to 0.020 inch. It has been calculated that the present invention will provide a heat exchanger thermal resistance of about 0.2 K/W cm$^2$, spatial temperature variations at 100 W/cm$^2$ of 10K, pressure drop of about 4 psi, and a package height of about half an inch.

In the embodiment of FIG. 1, a manifold 40 may be provided having an inlet fluid manifold 42 and an outlet fluid manifold 44 which would be particularly advantageous for a multi-chip package application. However, the inlet tube 30 and outlet tube 32 may be attached directly to hoses or other fluid conduits.

Other and further embodiments may be provided such as shown in FIG. 3 where like parts to those shown in FIGS. 1 and 2 are similarly numbered with the addition of the suffix "a." In this embodiment, the top plate 36 is omitted in order to encourage the impingement phenomenon of the incoming cooling liquid at the center of the base 14a of the heat exchanger 12a. The structure of FIG. 3 also allows the exiting liquid to pass across the upper portions of the fins 22a as it moves towards the outlet tube 32a. This flow pattern functions as a two-pass heat exchanger which tends to equalize spatial temperature variations.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. A fluid heat exchanger for cooling an electronic component comprising, a housing having a base for receiving heat from an electronic component, a plurality of parallel spaced fins each having a top, bottom, and two ends, said bottoms connected to the base, said fins being perpendicular to the base, the ends of the fins being tapered downwardly and outwardly from the tops to the bottoms for decreasing the pressure drop, and heat transfer to the ends of the fins, a fluid inlet tube communicating with the housing opposite the base and having a longitudinal axis perpendicular to the base, said axis directed toward the fins between the ends of the fins for directing a cooling fluid from the inlet tube towards the fins and the base and towards the ends of the fins, and a fluid outlet in communication with the ends of the fins, the tops of the fins include a recess in communication with the inlet tube for supplying cooling fluid to all of the fins, and a plate on the tops of the fins extending from the inlet tube to the downward taper at the ends of the fins for directing cooling fluid from the inlet tube towards both ends of the fins while minimizing the pressure drops at the ends.

2. The apparatus of claim 1 wherein the cross-sectional area of the inlet and outlet tubes are less than the cross-sectional area of the base and the longitudinal axis of the tubes is directed to the center of the base.

* * * * *